US012609145B2

(12) United States Patent
Lee et al.

(10) Patent No.: US 12,609,145 B2
(45) Date of Patent: Apr. 21, 2026

(54) ZQ CALIBRATION CIRCUIT AND ZQ CALIBRATION METHOD

(71) Applicant: SAMSUNG ELECTRONICS CO., LTD., Suwon-si (KR)

(72) Inventors: Bumsoo Lee, Suwon-si (KR); Youngtaek Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 18/386,463

(22) Filed: Nov. 2, 2023

(65) Prior Publication Data

US 2024/0221807 A1     Jul. 4, 2024

(30) Foreign Application Priority Data

Dec. 30, 2022   (KR) ........................ 10-2022-0191077

(51) Int. Cl.
G11C 7/22          (2006.01)

(52) U.S. Cl.
CPC ........ G11C 7/22 (2013.01); G11C 2207/2254 (2013.01)

(58) Field of Classification Search
CPC . G11C 7/22; G11C 2207/2254; G11C 29/022; G11C 29/028; G11C 7/1057; G11C 7/1084; G11C 7/10; H03K 19/0005
See application file for complete search history.

(56) References Cited

U.S. PATENT DOCUMENTS 7,626,416 B2   12/2009   Kim
7,710,143 B2   5/2010   Jeong et al.

8,384,423 B2   2/2013   Nguyen et al.
8,441,282 B2   5/2013   Kim
8,947,119 B2   2/2015   Jang
9,543,952 B2   1/2017   Lee
10,069,495 B2   9/2018   Jung et al.
10,868,519 B2   12/2020   Gans
11,121,714 B2   9/2021   Gans
2008/0219068 A1*   9/2008   Kim ......................... G11C 7/04
                                                            365/198
2022/0310137 A1*   9/2022   Song ...................... G11C 16/20
2024/0039535 A1*   2/2024   Shao ..................... G11C 7/1084
2024/0144981 A1*   5/2024   Lee .................... H03K 19/0005

FOREIGN PATENT DOCUMENTS

KR          10-0853466 B1     8/2008
KR       10-2010-0103146 A    9/2010

* cited by examiner

*Primary Examiner* — Donald H B Braswell

(74) *Attorney, Agent, or Firm* — Sughrue Mion, PLLC

(57)          ABSTRACT

Provided are a ZQ calibration circuit and a ZQ calibration method. The ZQ calibration circuit includes: a first calibration circuit; and a second calibration circuit sharing a first ZQ voltage with the first calibration circuit, wherein the first ZQ voltage is generated from a ZQ pad connected to an external resistor. The first calibration circuit includes: a first comparator; a second comparator; a first pull-up counter; a first pull-up driver; and a first switch electrically interconnecting the first pull-up counter. The second calibration circuit includes: a third comparator; a fourth comparator; a second pull-up counter; a second pull-up driver; and a second switch connected to the second pull-up counter and turned on based on a second logic level of the clock signal to electrically interconnect the second pull-up counter and the second pull-up driver.

20 Claims, 9 Drawing Sheets

ZQ CALIBRATION CIRCUIT AND ZQ CALIBRATION METHOD

CROSS-REFERENCE TO RELATED APPLICATIONS

This application is based on and claims priority under 35 U.S.C. § 119 to Korean Patent Application No. 10-2022-0191077, filed on Dec. 30, 2022, in the Korean Intellectual Property Office, the disclosure of which is incorporated by reference herein in its entirety.

BACKGROUND

The disclosure relates to a ZQ calibration circuit, and more particularly, to a ZQ calibration circuit and a ZQ calibration method capable of alternately performing calibrations based on a logic level of a clock signal.

As the demand for high-capacity memory increases, a multi-chip package in which a plurality of memory chips (or dies) independently operating through different channels are mounted within one package is provided. In a multi-chip package channel, each memory chip performs a ZQ calibration operation on signal lines for transmitting commands, addresses, and data of a corresponding memory chip. In this case, ZQ calibration operations need to be performed as many times as the number of mounted memory chips.

However, as ZQ calibration operations are performed multiple times that correspond to a number of memory chips mounted in a multi-chip package, it may be necessary to sequentially input ZQ calibration commands to their respective memory chips and wait until ZQ calibration operations based on the ZQ calibration commands of corresponding memory chips are sequentially performed. Therefore, the time elapsed for the ZQ calibration operations may be too long.

SUMMARY

Provided are a ZQ calibration circuit and a ZQ calibration method for performing a ZQ calibration based on a logic level of a clock signal, thereby reducing time elapsed for calibration operations.

According to an aspect of the disclosure, a ZQ calibration circuit includes: a first calibration circuit; and a second calibration circuit sharing a first ZQ voltage with the first calibration circuit, wherein the first ZQ voltage is generated from a ZQ pad connected to an external resistor, and wherein the first calibration circuit includes: a first comparator configured to generate a first counting signal by comparing the first ZQ voltage with a first reference voltage; a second comparator configured to generate a second counting signal by comparing the first ZQ voltage with a second reference voltage; a first pull-up counter configured to count a first pull-up code based on the first counting signal, the second counting signal, and a first counting enable signal; a first pull-up driver configured to pull-up drive the first ZQ voltage based on the first pull-up code; and a first switch electrically interconnecting the first pull-up counter and the first pull-up driver by being turned on based on a first logic level of a clock signal, and wherein the second calibration circuit includes: a third comparator configured to generate the first counting signal by comparing the first ZQ voltage with a third reference voltage; a fourth comparator configured to generate the second counting signal by comparing the first ZQ voltage with a fourth reference voltage; a second pull-up counter configured to count a second pull-up code based on the first counting signal, the second counting signal, and a second counting enable signal; a second pull-up driver configured to pull-up drive the first ZQ voltage based on the second pull-up code: and a second switch connected to the second pull-up counter and turned on based on a second logic level of the clock signal to electrically interconnect the second pull-up counter and the second pull-up driver.

According to another aspect of the disclosure, a ZQ calibration circuit includes: a first calibration circuit; and a second calibration circuit, wherein the first calibration circuit includes: a first comparator configured to generate a first counting signal by comparing a first ZQ voltage with a first reference voltage; a second comparator configured to generate a second counting signal by comparing the first ZQ voltage with a second reference voltage; a first pull-up counter configured to count a first pull-up code based on the first counting signal, the second counting signal, and a first counting enable signal; a first pull-up driver configured to pull-up drive the first ZQ voltage based on the first pull-up code; a first switch electrically interconnecting the first pull-up counter and the first pull-up driver by being turned on based on a first logic level of a clock signal; a third comparator configured to generate a third counting signal by comparing a second ZQ voltage, which is different from the first ZQ voltage, with the first reference voltage a fourth comparator configured to generate a fourth counting signal by comparing the second ZQ voltage with the second reference voltage; a first pull-down counter configured to count a first pull-down code based on the third counting signal, the fourth counting signal, and the first counting enable signal: and a first pull-down driver configured to pull-down drive the second ZQ voltage based on the first pull-down code.

According to another aspect of the disclosure, a ZQ calibration method includes: generating a first counting signal by comparing a first ZQ voltage with a first reference voltage; generating a second counting signal by comparing a first ZQ voltage with a second reference voltage; counting a first pull-up code based on the first counting signal, the second counting signal, and a first counting enable signal; turning on a first switch and turning off a second switch based on a first logic level of a clock signal; and pull-up driving the first ZQ voltage based on the first pull-up code.

BRIEF DESCRIPTION OF DRAWINGS

Embodiments of the disclosure will be more clearly understood from the following detailed description taken in conjunction with the accompanying drawings in which.

DETAILED DESCRIPTION OF EMBODIMENTS

Figure 1:
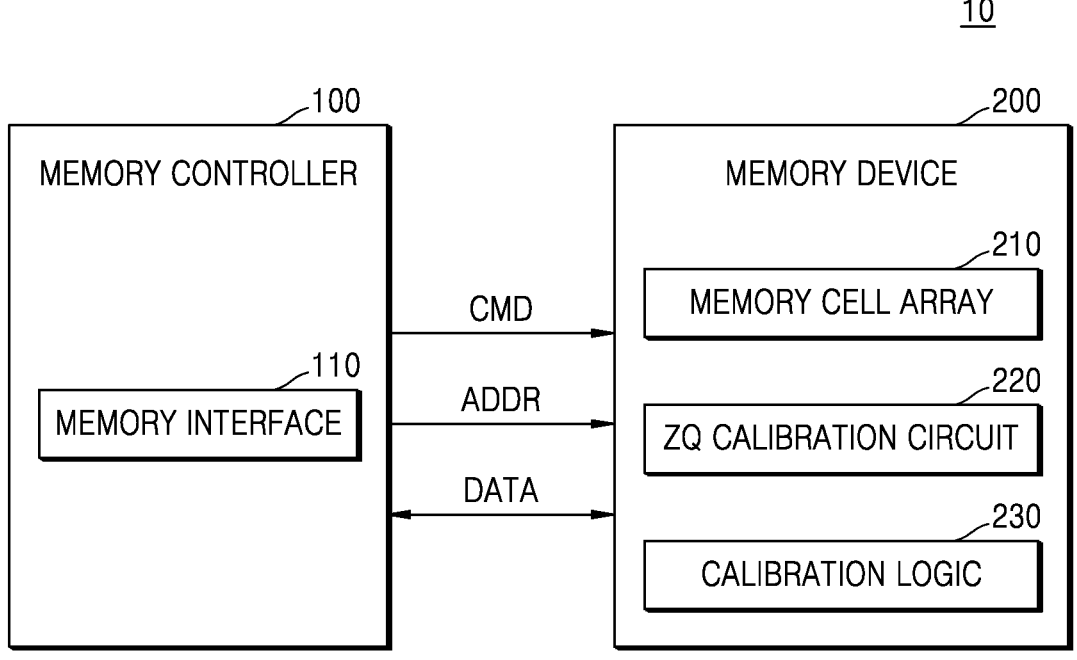
FIG. 1 is a diagram for describing a memory system according to the embodiments.

FIG. 1 is a diagram for describing a memory system 10 according to the embodiments.

Referring to FIG. 1, the memory system 10 may include a memory controller 100 and a memory device 200. The memory controller 100 may control memory operations like writing and reading by providing various signals to the memory device 200. For example, the memory controller 100 may include a memory interface 110 and provide a command CMD, a clock signal CLK, and an address ADDR to the memory device 200, thereby accessing data of a memory cell array 210.

The command CMD may include a command for a normal memory operation like data writing and data reading. Also, the memory controller 100 may provide commands CMD for various control operations within the memory device 200. For example, the memory controller 100 may provide a calibration command to the memory device 200. The memory device 200 may perform a calibration operation during initial driving or perform a calibration operation in response to or based on a calibration command, thereby setting a termination resistance value of an on-die termination (ODT) circuit in the memory device 200 or setting a resistance value of an output driver (or off-chip-driver (OCD)) circuit.

The memory controller 100 may access the memory device 200 based on a request from a host. The memory controller 100 may communicate with a host by using various protocols. For example, the memory controller 100 may communicate with the host by using an interface protocol like Peripheral Component Interconnect-Express (PCI-E), Advanced Technology Attachment (ATA), Serial ATA (SATA), Parallel ATA (PATA), or serial attached SCSI (SAS). In addition, various other interface protocols like Universal Serial Bus (USB), Multi-Media Card (MMC), Enhanced Small Disk Interface (ESDI), or Integrated Drive Electronics (IDE) may be applied to a protocol between a host and the memory controller 100.

The memory device 200 may include various types of memories, e.g., a dynamic random access memory (DRAM) like a double data rate synchronous dynamic random access memory (DDR SDRAM), a low power double data rate (LPDDR) SDRAM, a graphics double data rate (GDDR) SDRAM, a Rambus dynamic random access memory (RDRAM), etc. However, embodiments of the present disclosure are not necessarily limited thereto. For example, the memory device 200 may also include a non-volatile memory like a flash memory, a magnetic RAM (MRAM), a ferroelectric RAM (FeRAM), a phase change RAM (PRAM), and a resistive RAM (ReRAM).

The memory device 200 may communicate with the memory controller 100 through interfaces according to various standards. For example, the memory controller 100 and the memory device 200 may perform interfaces based on low power double data rate 4 (LPDDR4), LPDDR4X, LPDDR5, and various other standards.

Meanwhile, the memory device 200 may include the memory cell array 210, a ZQ calibration circuit 220, and a calibration logic 230. According to an embodiment, the memory device 200 may include an OCD circuit and an ODT circuit. However, the disclosure is not limited thereto, and the OCD circuit and the ODT circuit may be separately implemented in the memory device 200. For example, in the memory device 200, the OCD circuit includes a pull-up circuit and a pull-down circuit, and any one of the pull-up circuit and the pull-down circuit may be used as the ODT circuit. For example, in an operation of outputting the data DATA, the OCD circuit may perform a signal output operation using the pull-up circuit and the pull-down circuit, and, in an operation of receiving the data DATA, the pull-up circuit of the OCD circuit may be used as the ODT circuit for providing a termination resistance to a line to which the data DATA is input. The OCD circuit and the ODT circuit may adjust resistance (or impedance) thereof to prevent distortion of signals transmitted between the memory controller 100 and the memory device 200.

The ZQ calibration circuit 220 may perform a ZQ calibration operation to generate a pull-up code or a pull-down code to adjust the resistance of the OCD circuit and the ODT circuit. The ZQ calibration circuit 220 may generate various control codes for adjusting resistance values of the OCD circuit and the ODT circuit. The ZQ calibration circuit 220 may perform a calibration operation when the memory device 200 initially operates or periodically enters a ZQ calibration mode. In the ZQ calibration operation, the various control codes may be generated based on a feedback operation. As an example, the ZQ calibration circuit 220 may include a resistor circuit having the same characteristics as a pull-up resistor or a pull-down resistor, which is included in the OCD circuit and the ODT circuit.

The ZQ calibration circuit 220 may generate a pull-up code for adjusting resistance values of pull-up circuits of the OCD circuit and the ODT circuit. Or, the ZQ calibration circuit 220 may generate a pull-down code for adjusting resistance values of pull-down circuits of the OCD circuit and the ODT circuit. A generated pull-up code or pull-down code is set or stored inside the memory device 200 and may be used later for providing on-die termination resistance during a data write operation and a data read operations or adjusting the resistance value (or output power) of the OCD circuit (or an output driver circuit).

The ZQ calibration circuit 220 may include a first calibration circuit and a second calibration circuit. The configuration of the ZQ calibration circuit 220 will be described later with reference to FIG. 2.

The calibration logic 230 may determine a calibration instruction signal based on a result of a comparison between the level of a calibration power supply voltage input to the ZQ calibration circuit 220 and the level of a reference voltage. For example, when the calibration power supply voltage is greater than the reference voltage, the calibration logic 230 may provide a logic high calibration instruction signal to the ZQ calibration circuit 220. The logic high calibration instruction signal is a signal instructing the ZQ calibration circuit 220 to perform a ZQ calibration operation, and the ZQ calibration circuit 220 may generate various control codes to perform the ZQ calibration operation.

Figure 2:
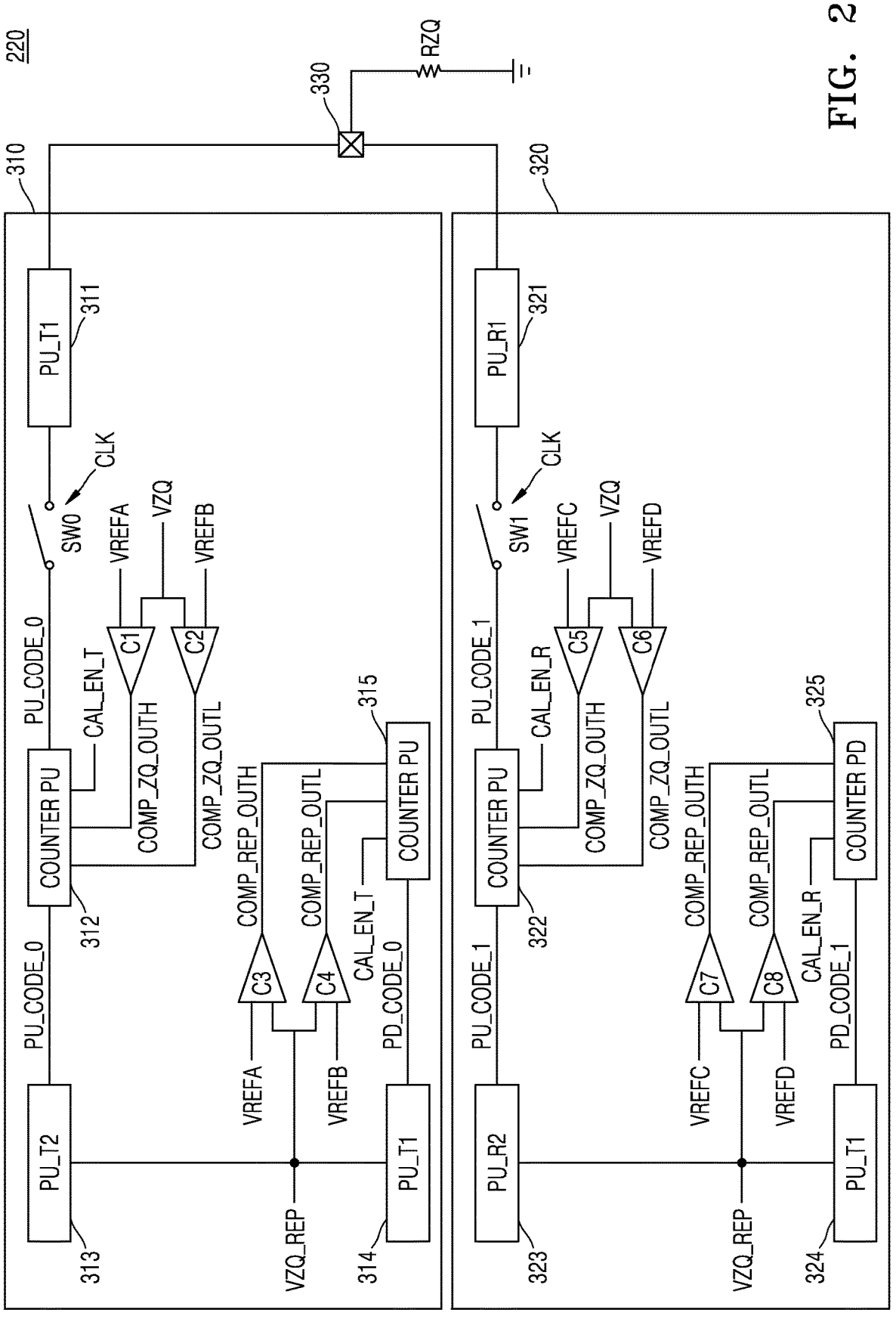
FIG. 2 is a diagram for describing a ZQ calibration circuit according to the embodiments.

FIG. 2 is a diagram for describing the ZQ calibration circuit 220 according to the embodiments.

Referring to FIG. 2, the ZQ calibration circuit 220 may include a first calibration circuit 310, a second calibration circuit 320, and a ZQ pad 330.

The ZQ pad 330 may be connected to an external resistor RZQ having a constant resistance value regardless of changes in PVT conditions.

The first calibration circuit 310 may include a first pull-up driver 311, a first pull-up counter 312, a second pull-up driver 313, a first pull-down counter 315, a first comparator C1, a second comparator C2, a third comparator C3, a fourth comparator C4, and a first switch SW0.

The first comparator C1 may generate a first counting signal COMP_ZQ_OUTH by comparing a first ZQ voltage VZQ with a first reference voltage VREFA. The second comparator C2 may generate a second counting signal COMP_ZQ_OUTL by comparing the first ZQ voltage VZQ with a second reference voltage VREFB.

The first reference voltage VREFA may be generated by a first reference voltage generating circuit, and the second reference voltage VREFB may be generated by a second reference voltage generating circuit. The first reference voltage generating circuit may generate the first reference voltage VREFA whose level is adjusted in response to or based on a control code. The second reference voltage generating circuit may generate the second reference voltage VREFB whose level is adjusted in response to or based on a control code. The voltage level of the first reference voltage VREFA may be different from the voltage level of the second reference voltage VREFB. The voltage level of the first reference voltage VREFA may be higher than the voltage level of the second reference voltage VREFB. For example, the voltage level of the first reference voltage VREFA may be 0.81V and the voltage level of the second reference voltage VREFB may be 0.79V.

When a first counting enable signal CAL_EN_T is an input with a first logic level (e.g., a logic high level), the first pull-up counter 312 may count a first pull-up code PU_T_CODE_0 based on the logic level of the first counting signal COMP_ZQ_OUTH. When a first counting enable signal CAL_EN_T is an input with a first logic level (e.g., a logic high level), the first pull-up counter 312 may count a first pull-up code PU_T_CODE_0 based on the logic level of the second counting signal COMP_ZQ_OUTL. In other words, when the first counting enable signal CAL_EN_T is an input with the first logic level, the first pull-up counter 312 may count the first pull-up code PU_T_CODE_0 based on the logic level of the first counting signal COMP_ZQ_OUTH or the second counting signal COMP_ZQ_OUTL.

The first switch SW0 may be turned on in response to or based on a first logic level (e.g., a logic high level) of the first clock signal CLK. As the first switch SW0 is turned on, the first pull-up counter 312 and the first pull-up driver 311 may be electrically connected to each other.

The first pull-up driver 311 may pull-up drive the first ZQ voltage VZQ in response to or based on the first pull-up code PU_T_CODE_0. The first pull-up driver 311 may pull-up drive the first ZQ voltage VZQ to output a first signal PU_T_CAL_DONE. When the voltage level of the first ZQ voltage VZQ is lower than or equal to the voltage level of the first reference voltage VREFA and equal to or higher than the voltage level of the second reference voltage VREFB, the first signal PU_T_CAL_DONE may be at a logic high level. When the voltage level of the first ZQ voltage VZQ is equal to or higher than the voltage level of the first reference voltage VREFA and lower than or equal to the voltage level of the second reference voltage VREFB, the first signal PU_T_CAL_DONE may be at a logic low level. For example, when the voltage level of the first ZQ voltage VZQ is 0.8V, the voltage level of the first reference voltage VREFA is 0.81V, and the voltage level of the second reference voltage VREFB is 0.79V., the first signal PU_T_CAL_DONE may be at a logic high level.

The third comparator C3 may generate a third counting signal COMP_REP_OUTH by comparing a second ZQ voltage VZQ_REP with the first reference voltage VREFA. The fourth comparator C4 may generate a fourth counting signal COMP_REF_OUTL by comparing the second ZQ voltage VZQ_REP with the second reference voltage VREFB. The second ZQ voltage VZQ_REP may be generated by the calibration logic 230. The voltage level of the second ZQ voltage VZQ_REP may be lower than the voltage level of the first ZQ voltage VZQ.

When the first counting enable signal CAL_EN_T is an input with a first logic level (e.g., a logic high level), the first pull-down counter 315 may count a first pull-down code PD_T_CODE_0 based on the logic level of the third counting signal COMP_REP_OUTH. When the first counting enable signal CAL_EN_T is an input with a first logic level (e.g., a logic high level), the first pull-down counter 315 may count the first pull-down code PD_T_CODE_0 based on the logic level of the fourth counting signal COMP_RE-F_OUTL. In other words, when the first counting enable signal CAL_EN_T is an input with the first logic level, the first pull-down counter 315 may count the first pull-down code PD_T_CODE_0 based on the logic level of the third counting signal COMP_REP_OUTH or the fourth counting signal COMP_REF_OUTL.

The second pull-up driver 313 may pull-up drive the second ZQ voltage VZQ_REP in response to or based on the first pull-up code PU_T_CODE_0.

A first pull-down driver 314 may pull-down drive the second ZQ voltage VZQ_REP in response to or based on the first pull-down code PD_T_CODE_0. The first pull-down driver 314 may pull-down drive the second ZQ voltage VZQ_REP to output a second signal PD_T_CAL_DONE. When the voltage level of the second ZQ voltage VZQ_REP is lower than or equal to the voltage level of the first reference voltage VREFA and equal to or higher than the voltage level of the second reference voltage VREFB, the second signal PD_T_CAL_DONE may be at a logic high level. When the voltage level of the second ZQ voltage VZQ_REP is equal to or higher than the voltage level of the first reference voltage VREFA and lower than or equal to the voltage level of the second reference voltage VREFB, the second signal PD_T_CAL_DONE may be at a logic low level. For example, when the voltage level of the second ZQ voltage VZQ_REP is 0.8V, the voltage level of the first reference voltage VREFA is 0.81V, and the voltage level of the second reference voltage VREFB is 0.79V, the second signal PD_T_CAL_DONE may be at a logic high level.

The second calibration circuit 320 may include a third pull-up driver 321, a second pull-up counter 322, a fourth pull-up driver 323, a second pull-down counter 325, a fifth comparator C5, a sixth comparator C6, a seventh comparator C7, an eighth comparator C8, and a second switch SW1.

The fifth comparator C5 may generate the first counting signal COMP_ZQ_OUTH by comparing the first ZQ voltage VZQ with a third reference voltage VREFC. The sixth comparator C6 may generate the second counting signal COMP_ZQ_OUTL by comparing the first ZQ voltage VZQ with a fourth reference voltage VREFD.

The third reference voltage VREFC may be generated by a third reference voltage generating circuit, and the fourth reference voltage VREFD may be generated by a fourth reference voltage generating circuit. The third reference voltage generating circuit may generate the third reference voltage VREFC whose level is adjusted in response to or based on a control code. The fourth reference voltage generating circuit may generate the fourth reference voltage VREFD whose level is adjusted in response to or based on a control code. The voltage level of the third reference voltage VREFC may be different from the voltage level of the fourth reference voltage VREFD. The voltage level of the third reference voltage VREFC may be higher than the voltage level of the fourth reference voltage VREFD. For example, the voltage level of the first reference voltage VREFA may be 0.34V, and the voltage level of the second reference voltage VREFB may be 0.32V.

When a second counting enable signal CAL_EN_R is an input with a first logic level (e.g., a logic high level), the second pull-up counter 322 may count a second pull-up code PU_T_CODE_1 based on the logic level of the first counting signal COMP_ZQ_OUTH. When the second counting enable signal CAL_EN_R is an input with a first logic level (e.g., a logic high level), the second pull-up counter 322 may count the second pull-up code PU_T_CODE_1 based on the logic level of the second counting signal COMP_ZQ_OUTL. In other words, when the second counting enable signal CAL_EN_R is an input with the first logic level, the second pull-up counter 322 may count the second pull-up code PU_T_CODE_1 based on the logic level of the first counting signal COMP_ZQ_OUTH or the second counting signal COMP_ZQ_OUTL.

The second switch SW1 may be turned on in response to or based on a second logic level (e.g., a logic low level) of the clock signal CLK. As the second switch SW1 is turned on, the second pull-up counter 322 and the third pull-up driver 321 may be electrically connected to each other.

The third pull-up driver 321 may pull-up drive the first ZQ voltage VZQ in response to or based on the second pull-up code PU_T_CODE_1. The third pull-up driver 321 may pull-up the first ZQ voltage VZQ to output a third signal PU_R_CAL_DONE. When the voltage level of the first ZQ voltage VZQ is lower than or equal to the voltage level of the first reference voltage VREFA and equal to or higher than the voltage level of the second reference voltage VREFB, the third signal PU_R_CAL_DONE may be at a logic high level. When the voltage level of the first ZQ voltage VZQ is equal to or higher than the voltage level of the first reference voltage VREFA and lower than or equal to the voltage level of the second reference voltage VREFB, the third signal PU_R_CAL_DONE may be at a logic low level. For example, when the voltage level of the first ZQ voltage VZQ is 0.8V, the voltage level of the first reference voltage VREFA is 0.81V, and the voltage level of the second reference voltage VREFB is 0.79V, the third signal PU_R_CAL_DONE may be at a logic high level.

The seventh comparator C7 may generate the third counting signal COMP_REP_OUTH by comparing the second ZQ voltage VZQ_REP with the third reference voltage VREFC. The eighth comparator C8 may generate the fourth counting signal COMP_REF_OUTL by comparing the second ZQ voltage VZQ_REP with the fourth reference voltage VREFD.

When the second counting enable signal CAL_EN_R is an input with a first logic level (e.g., a logic high level), the second pull-down counter 325 may count a second pull-down code PD_T_CODE_1 based on the logic level of the third counting signal COMP_REP_OUTH. When the second counting enable signal CAL_EN_R is an input with a first logic level (e.g., a logic high level), the second pull-down counter 325 may count the second pull-down code PD_T_CODE_1 based on the logic level of the fourth counting signal COMP_REF_OUTL. In other words, when the second counting enable signal CAL_EN_R is an input with the first logic level, the second pull-down counter 325 may count the second pull-down code PD_T_CODE_1 based on the logic level of the third counting signal COMP_REP_OUTH or the fourth counting signal COMP_RE-F_OUTL.

The fourth pull-up driver 323 may pull-up drive the second ZQ voltage VZQ_REP in response to or based on the second pull-up code PU_T_CODE_1.

A second pull-down driver 324 may pull-down drive the second ZQ voltage VZQ_REP in response to or based on the second pull-down code PD_T_CODE_1. The second pull-down driver 324 may pull-down drive the second ZQ voltage VZQ_REP to output a fourth signal PD_R_CAL_DONE. When the voltage level of the second ZQ voltage VZQ_REP is lower than or equal to the voltage level of the third reference voltage VREFC and equal to or higher than the voltage level of the fourth reference voltage VREFD, the fourth signal PD_R_CAL_DONE may be at a logic high level. When the voltage level of the second ZQ voltage VZQ_REP is equal to or higher than the voltage level of the third reference voltage VREFC or lower than or equal to the fourth reference voltage level, the fourth signal PD_R_CAL_DONE may be at a logic low level. For example, when the voltage level of the second ZQ voltage VZQ_REP is 0.8V, the voltage level of the third reference voltage VREFC is 0.81V, and the voltage level of the fourth reference voltage VREFD is 0.79V, the fourth signal PD_R_CAL_DONE may be at a logic high level.

According to the embodiment, the ZQ calibration circuit 220 may turn on and turn off the first switch SW0 and the second switch SW1 based on the logic level of the clock signal CLK, thereby performing calibration of the first calibration circuit 310 and calibration of the second calibration circuit 320 simultaneously. Since the calibration of the first calibration circuit 310 and the calibration of the second calibration circuit 320 may be performed simultaneously, the speed of performing calibration may be improved.

As described above, the ZQ calibration circuit 220 may perform the ZQ calibration by adjusting the level of a reference voltage based on the logic level of the clock signal CLK. Since the ZQ calibration circuit 220 may perform the ZQ calibration based on the logic level of the clock signal CLK, the calibration operation time may be shortened and the calibration operation speed may be improved.

Figure 3:
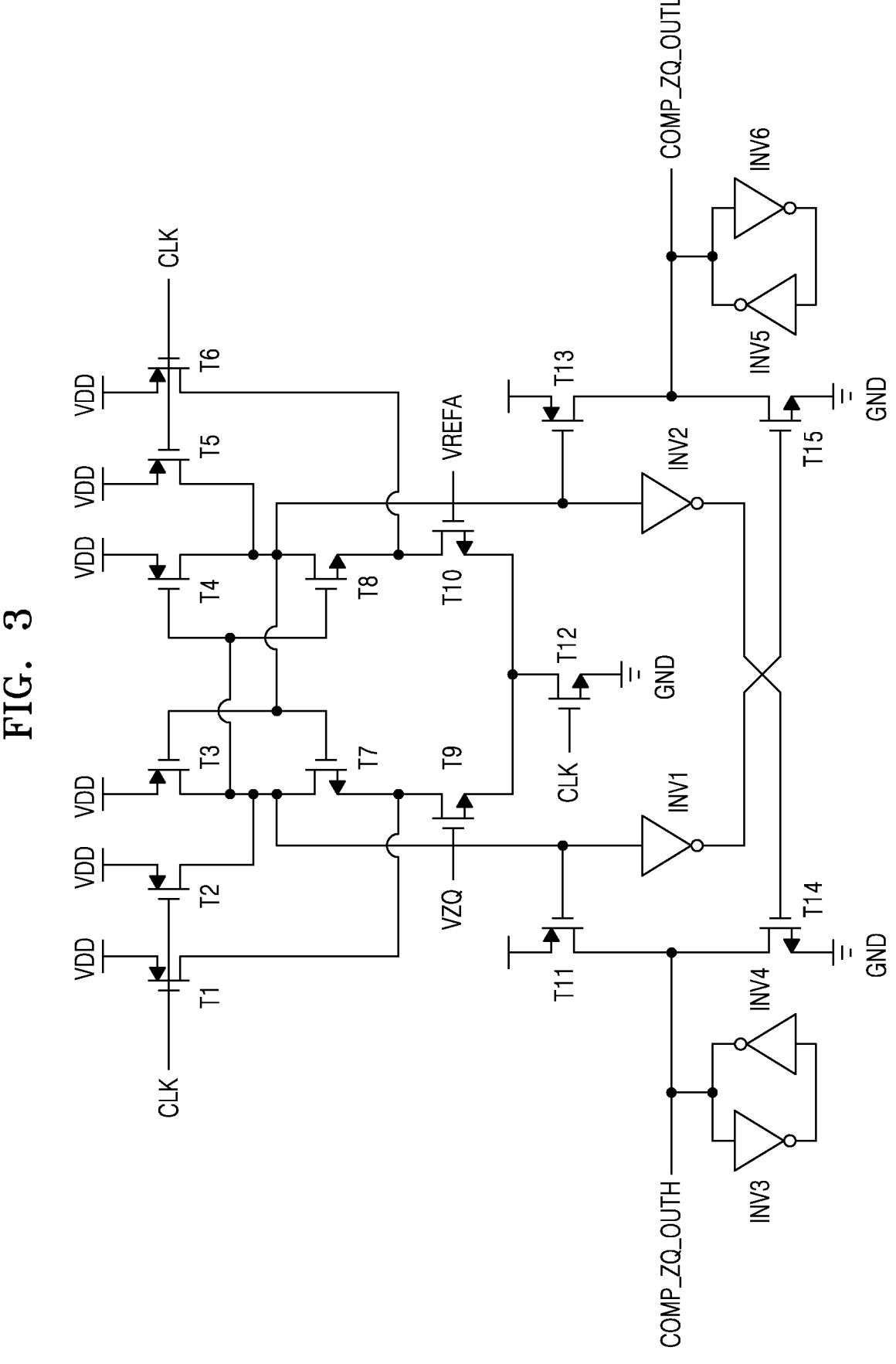
FIG. 3 is a circuit diagram for describing a comparator according to the embodiments.

FIG. 3 is a diagram for describing a comparator according to the embodiments.

Referring to FIG. 3, the first comparator C1 may include a plurality of transistors T1 to T15 and a plurality of inverters INV1 to INV6.

The clock signal CLK may be applied to gates of a first transistor T1, a second transistor T2, a fifth transistor T5, a sixth transistor T6, and a twelfth transistor T12. A power voltage VDD may be applied to first to sixth transistors T1 to T6. The first ZQ voltage VZQ may be applied to a gate of a ninth transistor T9. The first reference voltage VREFA may be applied to a gate of a tenth transistor T10. A ground voltage GND may be applied to first ends of a fourteenth transistor T14 and a fifteenth transistor T15.

The first comparator C1 may be configured to output the first counting signal COMP_ZQ_OUTH via a third inverter INV3 and a fourth inverter INV4. The first comparator C1 may be configured to output the second counting signal COMP_ZQ_OUTL through a fifth inverter INV5 and a sixth inverter INV6.

However, the configuration of the first comparator C1 is not necessarily limited thereto, and the first comparator C1 may have any configuration for comparing the first ZQ voltage VZQ with the first reference voltage VREFA and may include a combination of other elements.

Although FIG. 3 shows only the configuration of the first comparator C1, second to eighth comparators C2 to C8 may have the same configuration as the first comparator C1. Meanwhile, the configuration of a comparator is not necessarily limited thereto, and a comparator may include a combination of other elements.

Figure 4:
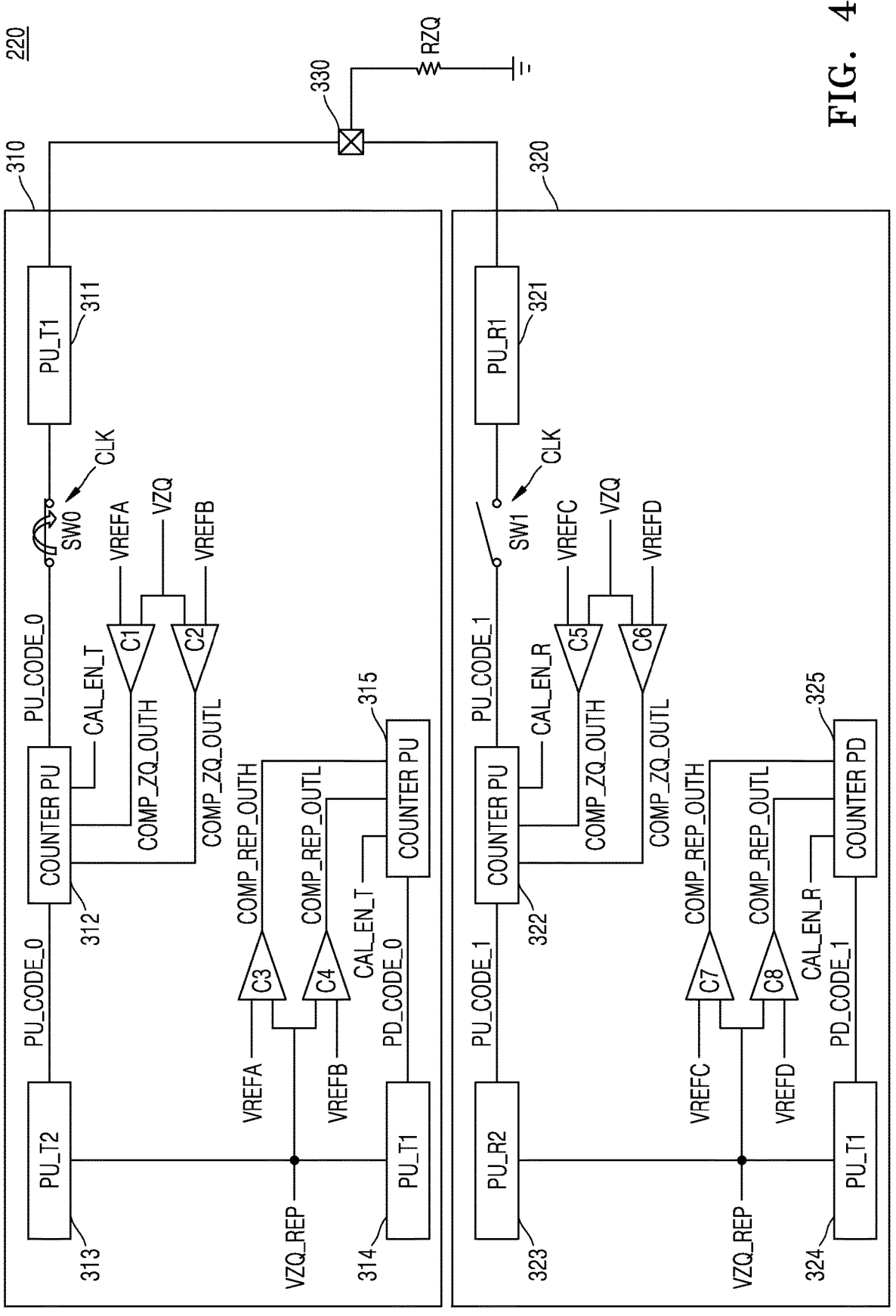
FIG. 4 is a diagram for describing a method of operating the ZQ calibration circuit when a first switch is turned on, according to the embodiments.

FIG. 4 is a diagram for describing a method of operating the ZQ calibration circuit when the first switch SW0 is turned on, according to the embodiments. Hereinafter, descriptions identical to those given above with reference to FIG. 2 will be omitted.

Referring to FIG. 4, the first switch SW0 may be turned on in response to or based on a first logic level (e.g., a logic high level) of the clock signal CLK. When the first switch SW0 is turned on, the first calibration circuit 310 may perform calibration, and the second calibration circuit 320 may not perform calibration. Hereinafter, the calibration of the first calibration circuit 310 will be described.

The first comparator C1 may generate the first counting signal COMP_ZQ_OUTH by comparing the first ZQ voltage VZQ with the first reference voltage VREFA. The second comparator C2 may generate the second counting signal COMP_ZQ_OUTL by comparing the first ZQ voltage VZQ with the second reference voltage VREFB.

When the first counting enable signal CAL_EN_T is an input with a first logic level (e.g., a logic high level), the first pull-up counter 312 may count the first pull-up code PU_T_CODE_0 based on the logic level of the first counting signal COMP_ZQ_OUTH. When the first counting enable signal CAL_EN_T is an input with a first logic level (e.g., a logic high level), the first pull-up counter 312 may count the first pull-up code PU_T_CODE_0 based on the logic level of the second counting signal COMP_ZQ_OUTL.

As the first switch SW0 is turned on, the first pull-up counter 312 and the first pull-up driver 311 may be electrically connected to each other.

The first pull-up driver 311 may pull-up drive the first ZQ voltage VZQ in response to or based on the first pull-up code PU_T_CODE_0. The first pull-up driver 311 may pull-up drive the first ZQ voltage VZQ to output the first signal PU_T_CAL_DONE.

The third comparator C3 may generate the third counting signal COMP_REP_OUTH by comparing the second ZQ voltage VZQ_REP with the first reference voltage VREFA. The fourth comparator C4 may generate the fourth counting signal COMP_REF_OUTL by comparing the second ZQ voltage VZQ_REP with the second reference voltage VREFB.

When the first counting enable signal CAL_EN_T is an input with a first logic level (e.g., a logic high level), the first pull-down counter 315 may count the first pull-down code PD_T_CODE_0 based on the logic level of the third counting signal COMP_REP_OUTH. When the first counting enable signal CAL_EN_T is an input with a first logic level (e.g., a logic high level), the first pull-down counter 315 may count the first pull-down code PD_T_CODE_0 based on the logic level of the fourth counting signal COMP_REF_OUTL.

The second pull-up driver 313 may pull-up drive the second ZQ voltage VZQ_REP in response to or based on the first pull-up code PU_T_CODE_0.

A first pull-down driver 314 may pull-down drive the second ZQ voltage VZQ_REP in response to or based on the first pull-down code PD_T_CODE_0. The first pull-down driver 314 may pull-down drive the second ZQ voltage VZQ_REP to output a second signal PD_T_CAL_DONE.

Figure 5:
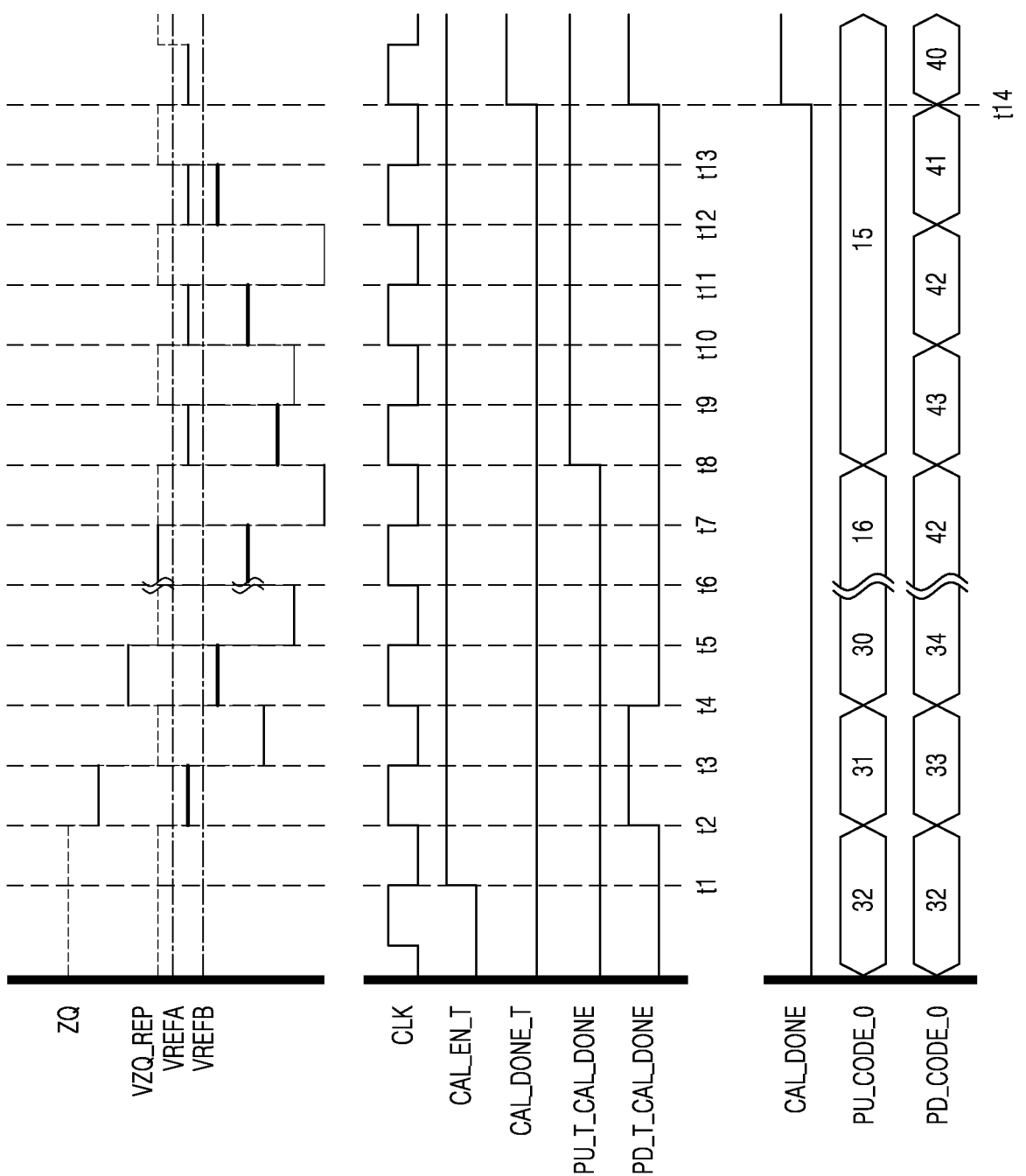
FIG. 5 is a timing diagram of the ZQ calibration circuit when the first switch is turned on, according to the embodiments.

FIG. 5 is a timing diagram of a ZQ calibration circuit when the first switch SW0 is turned on, according to embodiments.

Referring to FIGS. 4 and 5, the first switch SW0 of the first calibration circuit 310 may be turned on when the clock signal CLK is at a logic high level, and, as the first switch SW0 is turned on, the first calibration circuit 310 may perform the calibration.

At a first time point t1, the first counting enable signal CAL_EN_T may transition from a first level (e.g., low level) to a second level (e.g., high level). The first counting enable signal CAL_EN_T may maintain a high level after the first time point t1.

At a second time point t2, the clock signal CLK may transition from the first level to the second level. As the clock signal CLK transitions to the second level, the first switch SW0 may be turned on. Since the voltage level of the second ZQ voltage VZQ_REP is lower than or equal to the voltage level of the first reference voltage VREFA and equal to or higher than the voltage level of the second reference voltage VREFB, the second signal PD_T_CAL_DONE may transition from the first level to the second level. For example, when the voltage level of the second ZQ voltage VZQ_REP is 0.8V, the voltage level of the first reference voltage VREFA is 0.81V, and the voltage level of the second reference voltage VREFB is 0.79V., the second signal PD_T_CAL_DONE may transition from a low level to a high level.

At a third point t3, the clock signal CLK may transition from the second level to the first level. As the clock signal CLK transitions to the first level, the first switch SW0 may be turned off. However, since the voltage level of the second ZQ voltage VZQ_REP is still lower than or equal to the voltage level of the first reference voltage VREFA and equal to or higher than the voltage level of the second reference voltage VREFB, the second signal PD_T_CAL_DONE may maintain the second level.

At a fourth time point t4, the second signal PD_T_CAL_DONE may maintain the second level.

At a fifth time point t5, since the voltage level of the second ZQ voltage VZQ_REP is lower than or equal to the voltage level of the second reference voltage VREFB, the second signal PD_T_CAL_DONE may transition from the second level to the first level.

At a sixth time point t6 and a seventh time point t7, the second signal PD_T_CAL_DONE may maintain the first level.

At an eighth time point t8, the clock signal CLK may transition from the first level to the second level. As the clock signal CLK transitions to the second level, the first switch SW0 may be turned on. Since the voltage level of the first ZQ voltage VZQ is lower than or equal to the voltage level of the first reference voltage VREFA and equal to or higher than the voltage level of the second reference voltage VREFB, the first signal PU_T_CAL_DONE may transition from the first level to the second level. For example, when the voltage level of the first ZQ voltage VZQ is 0.8V, the voltage level of the first reference voltage VREFA is 0.81V, and the voltage level of the second reference voltage VREFB is 0.79V, the first signal PU_T_CAL_DONE may transition from a low level to a high level.

At a ninth time point t9, the clock signal CLK may transition from the second level to the first level. As the clock signal CLK transitions to the first level, the first switch SW0 may be turned off. However, since the voltage level of the first ZQ voltage VZQ_REP is still lower than or equal to the voltage level of the first reference voltage VREFA and equal to or higher than the voltage level of the second reference voltage VREFB, the first signal PU_T_CAL_DONE may maintain the second level.

The first signal PU_T_CAL_DONE may maintain the second level from an eleventh time point t11 to a thirteenth time point t13.

At a fourteenth time point t14, since the voltage level of the second ZQ voltage VZQ_REP is lower than or equal to the voltage level of the first reference voltage VREFA and equal to or higher than the voltage level of the second reference voltage VREFB, the second signal PD_T_CAL_DONE may transition from the first level to the second level.

At the fourteenth time point t14, since both the first signal PU_T_CAL_DONE and the second signal PD_T_CAL_DONE are at the second level, a first completion signal CAL_DONE_T may transition from the first level to the second level. As a first completion signal CAL_DONE_T transitions to the second level, calibration of the first calibration circuit 310 may be terminated. The first completion signal CAL_DONE_T may be generated by the calibration logic 230.

Figure 6:
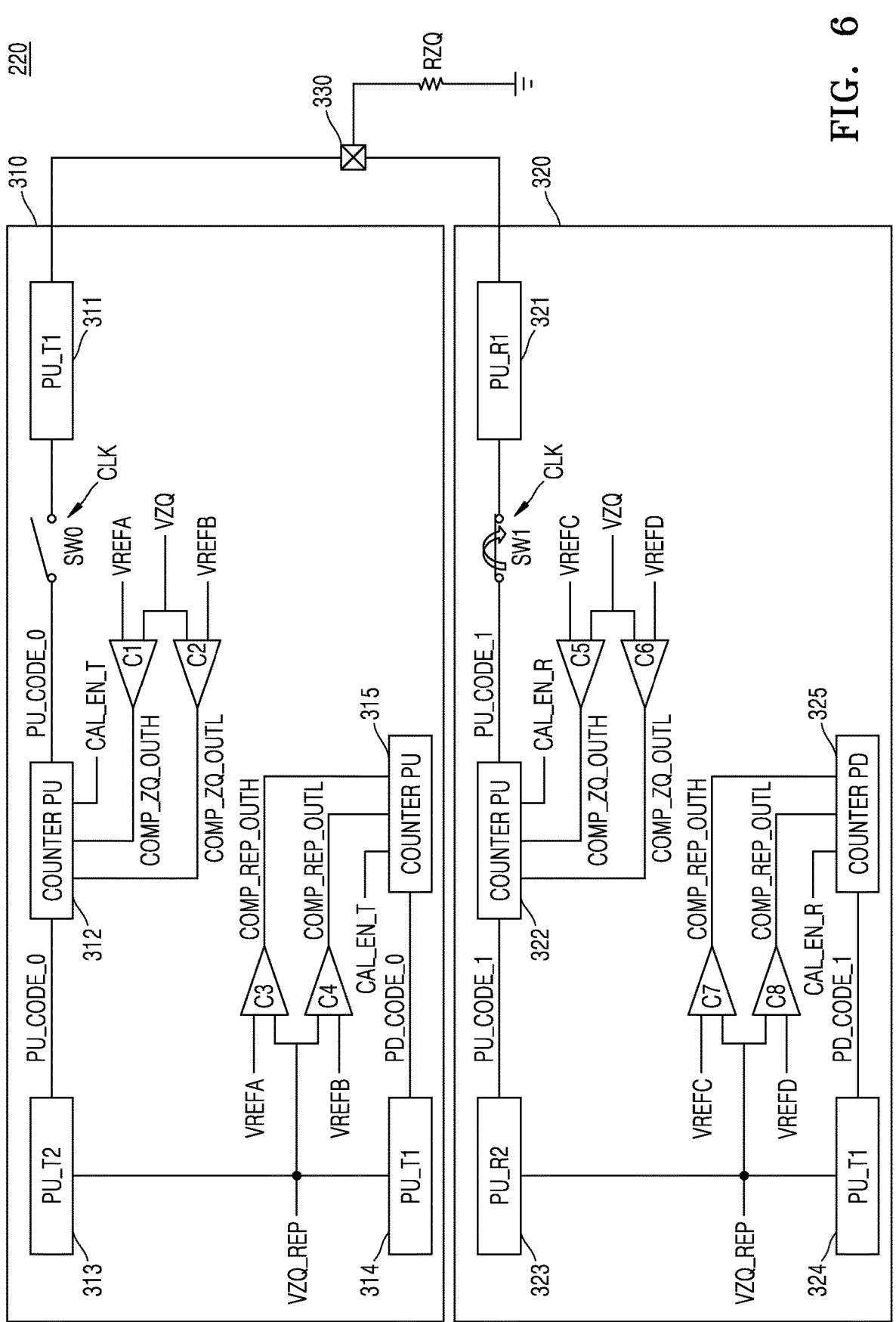
FIG. 6 is a diagram for describing a method of operating the ZQ calibration circuit when a second switch is turned on, according to the embodiments.

FIG. 6 is a diagram for describing a method of operating the ZQ calibration circuit when the second switch SW1 is turned on, according to embodiments. Hereinafter, descriptions identical to those given above with reference to FIG. 2 will be omitted.

Referring to FIG. 6, the second switch SW1 may be turned on in response to or based on a second logic level (e.g., a logic low level) of the clock signal CLK. When the second switch SW1 is turned on, the second calibration circuit 320 may perform calibration, and the first calibration circuit 310 may not perform calibration. Hereinafter, the calibration of the second calibration circuit 320 will be described.

The fifth comparator C5 may generate the first counting signal COMP_ZQ_OUTH by comparing the first ZQ voltage VZQ with the third reference voltage VREFC. The sixth comparator C6 may generate the second counting signal COMP_ZQ_OUTL by comparing the first ZQ voltage VZQ with the fourth reference voltage VREFD.

When a second counting enable signal CAL_EN_R is an input with a first logic level (e.g., a logic high level), the second pull-up counter 322 may count the second pull-up code PU_T_CODE_1 based on the logic level of the first counting signal COMP_ZQ_OUTH. When the second counting enable signal CAL_EN_R is an input with a first logic level (e.g., a logic high level), the second pull-up counter 322 may count the second pull-up code PU_T_CODE_1 based on the logic level of the second counting signal COMP_ZQ_OUTL.

As the second switch SW1 is turned on, the second pull-up counter 322 and the third pull-up driver 321 may be electrically connected to each other.

The third pull-up driver 321 may pull-up drive the first ZQ voltage VZQ in response to or based on the second pull-up code PU_T_CODE_1. The third pull-up driver 321 may pull-up the first ZQ voltage VZQ to output the third signal PU_R_CAL_DONE.

The seventh comparator C7 may generate the third counting signal COMP_REP_OUTH by comparing the second ZQ voltage VZQ_REP with the third reference voltage VREFC. The eighth comparator C8 may generate the fourth counting signal COMP_REF_OUTL by comparing the second ZQ voltage VZQ_REP with the fourth reference voltage VREFD.

When the second counting enable signal CAL_EN_R is an input with a first logic level (e.g., a logic high level), the second pull-down counter 325 may count the second pull-down code PD_T_CODE_1 based on the logic level of the third counting signal COMP_REP_OUTH. When the second counting enable signal CAL_EN_R is an input with a first logic level (e.g., a logic high level), the second pull-down counter 325 may count the second pull-down code PD_T_CODE_1 based on the logic level of the fourth counting signal COMP_REF_OUTL.

The fourth pull-up driver 323 may pull-up drive the second ZQ voltage VZQ_REP in response to or based on the second pull-up code PU_T_CODE_1.

The second pull-down driver 324 may pull-down drive the second ZQ voltage VZQ_REP in response to or based on the second pull-down code PD_T_CODE_1. The second pull-down driver 324 may pull-down drive the second ZQ voltage VZQ_REP to output the fourth signal PD_R_CAL_DONE.

Figure 7:
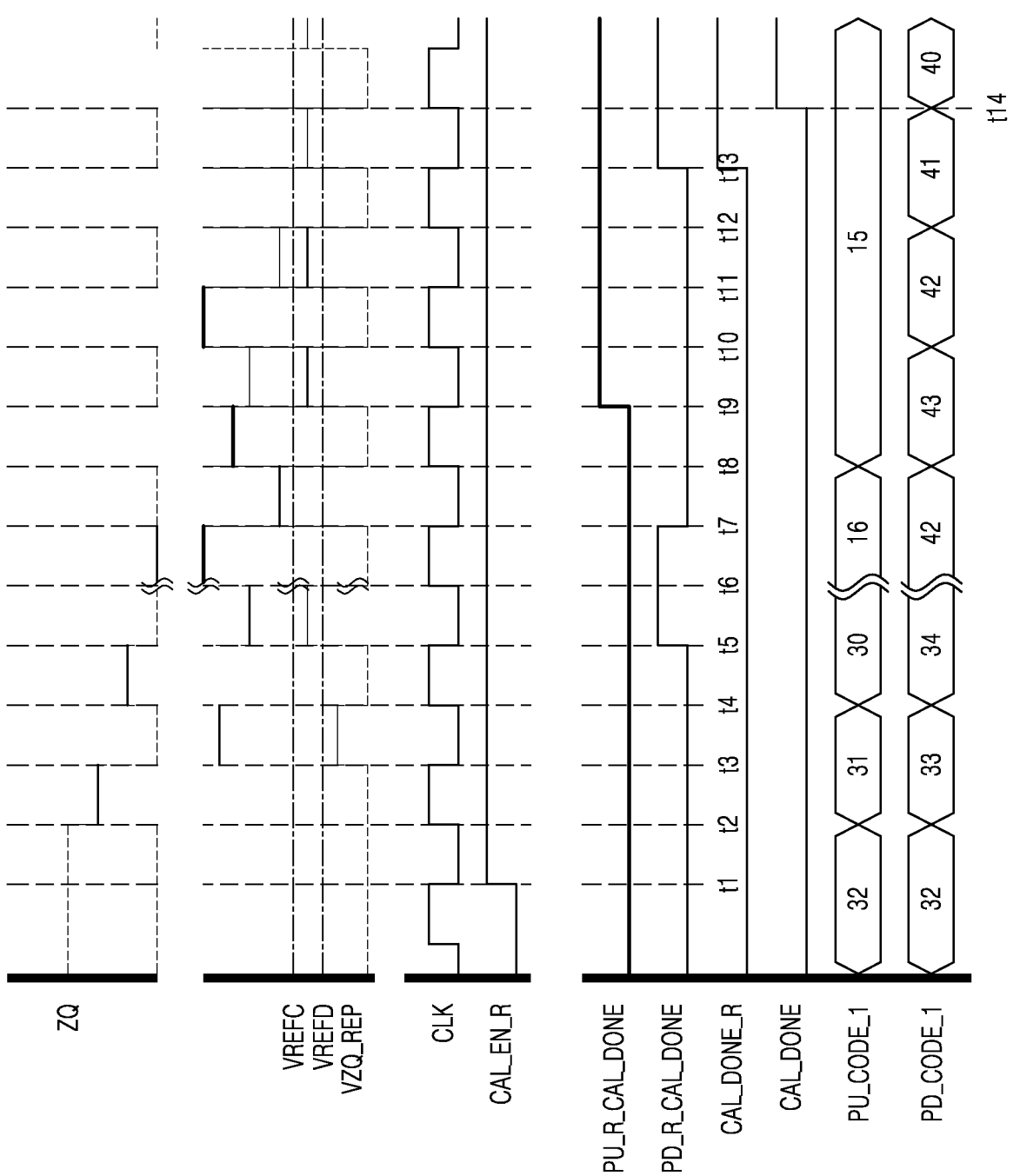
FIG. 7 is a timing diagram of the ZQ calibration circuit when the second switch is turned on, according to the embodiments.

FIG. 7 is a timing diagram of the ZQ calibration circuit when the second switch is turned on, according to embodiments.

Referring to FIGS. 6 and 7, the second switch SW1 of the second calibration circuit 320 may be turned on when the clock signal CLK is at a logic low level, and, as the second switch SW1 is turned on, the second calibration circuit 320 may perform calibration.

At a first time point t1, the second counting enable signal CAL_EN_R may transition from a first level (e.g., low level) to a second level (e.g., high level). The second counting enable signal CAL_EN_R may maintain a high level after the first time point t1.

At a fifth time point t5, the clock signal CLK may transition from the second level to the first level. As the clock signal CLK transitions to the first level, the second switch SW1 may be turned on. Since the voltage level of the second ZQ voltage VZQ_REP is lower than or equal to the voltage level of the third reference voltage VREFC and equal to or higher than the voltage level of the fourth reference voltage VREFD, the fourth signal PD_R_CAL_DONE may transition from the first level to the second level. For example, when the voltage level of the second ZQ voltage VZQ_REP is 0.8V, the voltage level of the third reference voltage VREFC is 0.81V, and the voltage level of the fourth reference voltage VREFD is 0.79V, the fourth signal PD_R_CAL_DONE may transition from a low level to a high level.

At a sixth time point t6, the clock signal CLK may transition from the first level to the second level. As the clock signal CLK transitions to the second level, the second switch SW1 may be turned off. However, since the voltage level of the second ZQ voltage VZQ_REP is still lower than or equal to the voltage level of the third reference voltage VREFC and equal to or higher than the voltage level of the fourth reference voltage VREFD, the fourth signal PD_R_CAL_DONE may maintain the second level.

At a seventh time point t7, since the voltage level of the second ZQ voltage VZQ_REP is equal to or higher than the voltage level of the third reference voltage VREFC, the fourth signal PD_R_CAL_DONE may transition from the second level to the first level.

At an eighth time point t8, the fourth signal PD_R_CAL_DONE may maintain the first level.

At a ninth time point t9, the clock signal CLK may transition from the second level to the first level. As the clock signal CLK transitions to the first level, the second switch SW1 may be turned on. Since the voltage level of the first ZQ voltage VZQ is lower than or equal to the voltage level of the first reference voltage VREFA and equal to or higher than the voltage level of the second reference voltage VREFB, the third signal PU_R_CAL_DONE may transition from the first level to the second level. For example, when the voltage level of the first ZQ voltage VZQ is 0.8V, the voltage level of the first reference voltage VREFA is 0.81V, and the voltage level of the second reference voltage VREFB is 0.79V, the third signal PU_R_CAL_DONE may transition from a low level to a high level.

From a tenth time point t10 to a thirteenth time point t13, the third signal PU_R_CAL_DONE may maintain the second level.

At the thirteenth time point t13, since the voltage level of the second ZQ voltage VZQ_REP is lower than or equal to the voltage level of the third reference voltage VREFC and equal to or higher than the voltage level of the fourth reference voltage VREFD, the third signal PU_R_CAL_DONE may transition from the first level to the second level.

At the thirteenth time point t13, since both the third signal PU_R_CAL_DONE and the fourth signal PD_R_CAL_DONE are at the second level, a second completion signal CAL_DONE_R may transition from the first level to the second level. As the second completion signal CAL_DONE_R transitions to the second level, calibration of the second calibration circuit 320 may be terminated. The second completion signal CAL_DONE_R may be generated by the calibration logic 230 (FIG. 1).

At a fourteenth time point t14, since both the first completion signal CAL_DONE_T and the second completion signal CAL_DONE_R are at the second level, a calibration completion signal CAL_DONE may transition from the first level to the second level. As the calibration completion signal CAL_DONE transitions to the second level, calibration of the ZQ calibration circuit 220 (FIG. 1) may be terminated. The calibration completion signal CAL_DONE may be generated by the calibration logic 230 (FIG. 1).

Figure 8:
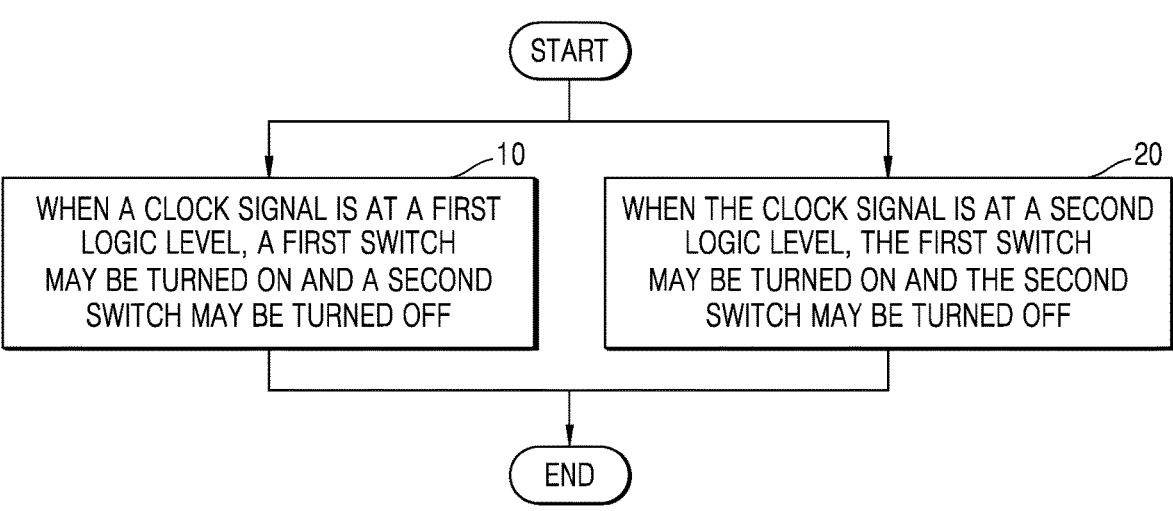
FIG. 8 is a flowchart of a method of operating the ZQ calibration circuit according to the embodiments.

FIG. 8 is a flowchart of a method of operating the ZQ calibration circuit according to the embodiments.

Since the method of operating the ZQ calibration circuit shown in FIG. 8 has been described above with reference to FIGS. 2 and 4 to 7, descriptions identical those already given above will be omitted.

Referring to FIG. 8, in operation S10, in a ZQ calibration circuit, when a clock signal is at a first logic level, a first switch may be turned on and a second switch may be turned off.

For example, when the clock signal CLK is at a first logic level (e.g., a logic high level), the first calibration circuit 310 may perform calibration, and the second calibration circuit 320 may not perform calibration.

In operation S20, in the ZQ calibration circuit, when the clock signal is at a second logic level, the first switch may be turned on and the second switch may be turned off.

For example, when the clock signal CLK is at a second logic level (e.g., logic low level), the first calibration circuit 310 may not perform calibration, and the second calibration circuit 320 may perform calibration.

The ZQ calibration circuit according to the embodiments may turn on and turn off the first switch SW0 and the second switch SW1 based on the logic level of the clock signal CLK, thereby performing calibration of the first calibration circuit 310 and calibration of the second calibration circuit 320 simultaneously. Since calibration of the first calibration circuit 310 and calibration of the second calibration circuit 320 may be performed simultaneously, the speed of performing calibration may be improved.

Figure 9:
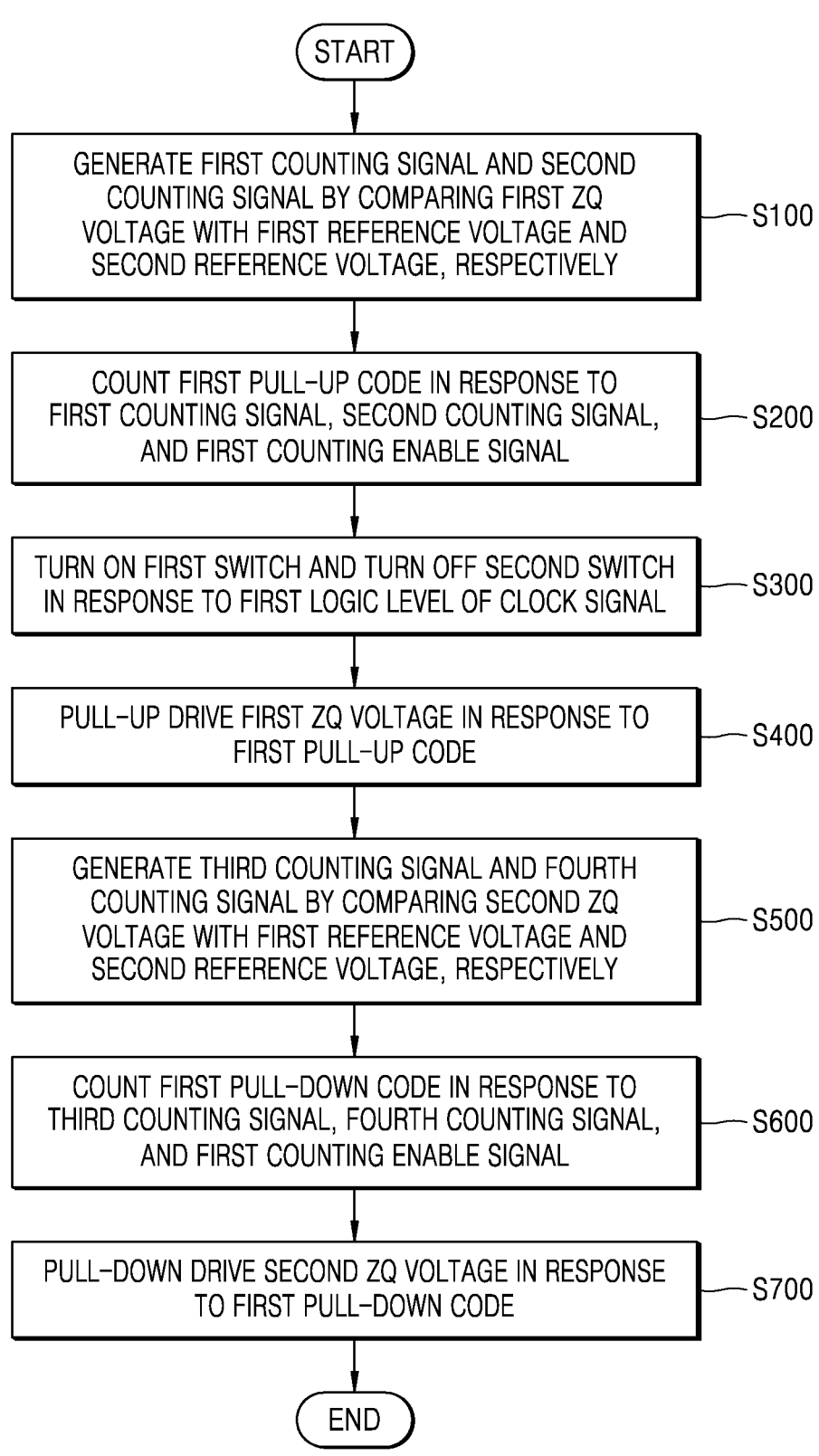
FIG. 9 is a flowchart of a method of operating the ZQ calibration circuit according to the embodiments.

FIG. 9 is a flowchart of a method of operating the ZQ calibration circuit according to the embodiments.

Since the method of operating the ZQ calibration circuit shown in FIG. 9 has been described above with reference to FIGS. 2 and 4 to 8, descriptions identical those already given above will be omitted.

Referring to FIG. 9, in operation S100, a first counting signal and a second counting signal may be generated by comparing a first reference voltage with a second reference voltage.

For example, referring to FIG. 2, the first comparator C1 may generate the first counting signal COMP_ZQ_OUTH by comparing the first ZQ voltage VZQ with the first reference voltage VREFA. The second comparator C2 may generate the second counting signal COMP_ZQ_OUTL by comparing the first ZQ voltage VZQ with the second reference voltage VREFB. The fifth comparator C5 may generate the first counting signal COMP_ZQ_OUTH by comparing the first ZQ voltage VZQ with the third reference voltage VREFC. The sixth comparator C6 may generate the second counting signal COMP_ZQ_OUTL by comparing the first ZQ voltage VZQ with the fourth reference voltage VREFD.

In operation S200, a first pull-up code may be counted in response to or based on a first counting signal, a second counting signal, and a first counting enable signal.

For example, referring to FIG. 2, when the first counting enable signal CAL_EN_T is an input with the first logic level, the first pull-up counter 312 may count the first pull-up code PU_T_CODE_0 based on the logic level of the first counting signal COMP_ZQ_OUTH or the second counting signal COMP_ZQ_OUTL. When the second counting enable signal CAL_EN_R is an input with the first logic level, the second pull-up counter 322 may count the second pull-up code PU_T_CODE_1 based on the logic level of the first counting signal COMP_ZQ_OUTH or the second counting signal COMP_ZQ_OUTL.

In operation S300, the first switch may be turned on and the second switch may be turned off in response to or based on the first logic level of the clock signal.

For example, referring to FIG. 2, the first switch SW0 may be turned on in response to or based on a first logic level (e.g., a logic high level) of the clock signal CLK. The second switch SW1 may be turned on in response to or based on a second logic level (e.g., a logic low level) of the clock signal CLK.

In operation S400, a first ZQ voltage may be pull-up driven in response to or based on a first pull-up code.

For example, referring to FIG. 2, the first pull-up driver 311 may pull-up drive the first ZQ voltage VZQ in response to or based on the first pull-up code PU_T_CODE_0. The third pull-up driver 321 may pull-up drive the first ZQ voltage VZQ in response to or based on the second pull-up code PU_T_CODE_1.

In operation S500, a third counting signal and a fourth counting signal may be generated by comparing a second ZQ voltage with a first reference voltage and a second reference voltage.

For example, referring to FIG. 2, the third comparator C3 may generate the third counting signal COMP_REP_OUTH by comparing the second ZQ voltage VZQ_REP with the first reference voltage VREFA. The fourth comparator C4 may generate the fourth counting signal COMP_RE- F_OUTL by comparing the second ZQ voltage VZQ_REP with the second reference voltage VREFB. The seventh comparator C7 may generate the third counting signal COMP_REP_OUTH by comparing the second ZQ voltage VZQ_REP with the third reference voltage VREFC. The eighth comparator C8 may generate the fourth counting signal COMP_REF_OUTL by comparing the second ZQ voltage VZQ_REP with the fourth reference voltage VREFD.

In operation S600, a first pull-down code may be counted in response to or based on a third counting signal, a fourth counting signal, and the first counting enable signal.

For example, referring to FIG. 2, when the first counting enable signal CAL_EN_T is an input with the first logic level, the first pull-down counter 315 may count the first pull-down code PD_T_CODE_0 based on the logic level of the third counting signal COMP_REP_OUTH or the fourth counting signal COMP_REF_OUTL. When the second counting enable signal CAL_EN_R is an input with the first logic level, the second pull-down counter 325 may count the second pull-down code PD_T_CODE_1 based on the logic level of the third counting signal COMP_REP_OUTH or the fourth counting signal COMP_REF_OUTL.

In operation S700, a second ZQ voltage may be pull-down driven in response to or based on the first pull-down code.

For example, referring to FIG. 2, the first pull-down driver 314 may pull-down drive the second ZQ voltage VZQ_REP in response to or based on the first pull-down code PD_T_CODE_0. The second pull-down driver 324 may pull-down drive the second ZQ voltage VZQ_REP in response to or based on the second pull-down code PD_T_CODE_1.

While the disclosure has been particularly shown and described with reference to embodiments thereof, it will be understood that various changes in form and details may be made therein without departing from the spirit and scope of the following claims.

What is claimed is:

1. A ZQ calibration circuit comprising:
a first calibration circuit; and
a second calibration circuit sharing a first ZQ voltage with the first calibration circuit,
wherein the first ZQ voltage is generated from a ZQ pad connected to an external resistor, and
wherein the first calibration circuit comprises:
a first comparator configured to generate a first counting signal by comparing the first ZQ voltage with a first reference voltage;
a second comparator configured to generate a second counting signal by comparing the first ZQ voltage with a second reference voltage;
a first pull-up counter configured to count a first pull-up code based on the first counting signal, the second counting signal, and a first counting enable signal;
a first pull-up driver configured to pull-up drive the first ZQ voltage based on the first pull-up code; and
a first switch electrically interconnecting the first pull-up counter and the first pull-up driver by being turned on based on a first logic level of a clock signal, and
wherein the second calibration circuit comprises:
a third comparator configured to generate a third counting signal by comparing the first ZQ voltage with a third reference voltage;
a fourth comparator configured to generate a fourth counting signal by comparing the first ZQ voltage with a fourth reference voltage;

a second pull-up counter configured to count a second pull-up code based on the third counting signal, the fourth counting signal, and a second counting enable signal;
a second pull-up driver configured to pull-up drive the first ZQ voltage based on the second pull-up code; and
a second switch connected to the second pull-up counter and turned on based on a second logic level of the clock signal to electrically interconnect the second pull-up counter and the second pull-up driver.

2. The ZQ calibration circuit of claim 1, wherein, based on a logic level of the clock signal, the first switch and the second switch are complementary with respect to each other.

3. The ZQ calibration circuit of claim 1, wherein the first calibration circuit further comprises:
a fifth comparator configured to generate a fifth counting signal by comparing a second ZQ voltage with the first reference voltage;
a sixth comparator configured to generate a sixth counting signal by comparing the second ZQ voltage with the second reference voltage;
a first pull-down counter configured to count a first pull-down code based on the fifth counting signal, the sixth counting signal, and the first counting enable signal; and
a first pull-down driver configured to pull-down drive the second ZQ voltage based on the first pull-down code, and
wherein the second calibration circuit further comprises:
a seventh comparator configured to generate a seventh counting signal by comparing the second ZQ voltage with the first reference voltage;
an eighth comparator configured to generate an eighth counting signal by comparing the second ZQ voltage with the second reference voltage;
a second pull-down counter configured to count a second pull-down code based on the seventh counting signal, the eighth counting signal, and the first counting enable signal; and
a second pull-down driver configured to pull-down drive the second ZQ voltage based on the second pull-down code.

4. The ZQ calibration circuit of claim 3, wherein the first pull-up driver is configured to output a first signal,
wherein the first pull-down driver is configured to output a second signal,
wherein the second pull-up driver is configured to output a third signal, and
wherein the second pull-down driver is configured to output a fourth signal.

5. The ZQ calibration circuit of claim 4, wherein a level of the first reference voltage is higher than a level of the second reference voltage, and,
wherein, based on a level of the first ZQ voltage that is lower than or equal to the level of the first reference voltage and that is equal to or higher than the level of the second reference voltage, the first signal is at a logic high level.

6. The ZQ calibration circuit of claim 4, wherein, based on a level of the second ZQ voltage that is lower than or equal to the level of the first reference voltage and that is equal to or higher than the level of the second reference voltage, the second signal is at a logic high level.

7. The ZQ calibration circuit of claim 4, wherein, based on the first signal and the second signal that are at a logic high level, a first completion signal is at a logic high level.

8. The ZQ calibration circuit of claim 4, wherein a level of the third reference voltage is higher than a level of the fourth reference voltage, and, wherein, based on a level of the first ZQ voltage that is lower than or equal to the level of the third reference voltage and that is equal to or higher than the level of the fourth reference voltage, the third signal is at a logic high level.

9. The ZQ calibration circuit of claim 4, wherein a level of the third reference voltage is higher than a level of the fourth reference voltage, and, wherein, based on a level of the second ZQ voltage that is lower than or equal to the level of the third reference voltage and that is equal to or higher than the level of the fourth reference voltage, the fourth signal is at a logic high level.

10. The ZQ calibration circuit of claim 4, wherein, based on the third signal and the fourth signal that are at a logic high level, a second completion signal is at a logic high level.

11. A ZQ calibration circuit comprising:

a first calibration circuit; and a second calibration circuit, wherein the first calibration circuit comprises:

a first comparator configured to generate a first counting signal by comparing a first ZQ voltage with a first reference voltage, wherein the first ZQ voltage is generated from a ZQ pad connected to an external resistor;

a second comparator configured to generate a second counting signal by comparing the first ZQ voltage with a second reference voltage;

a first pull-up counter configured to count a first pull-up code based on the first counting signal, the second counting signal, and a first counting enable signal;

a first pull-up driver configured to pull-up drive the first ZQ voltage based on the first pull-up code;

a first switch electrically interconnecting the first pull-up counter and the first pull-up driver by being turned on based on a first logic level of a clock signal;

a third comparator configured to generate a third counting signal by comparing a second ZQ voltage, which is different from the first ZQ voltage, with the first reference voltage;

a fourth comparator configured to generate a fourth counting signal by comparing the second ZQ voltage with the second reference voltage;

a first pull-down counter configured to count a first pull-down code based on the third counting signal, the fourth counting signal, and the first counting enable signal; and a first pull-down driver configured to pull-down drive the second ZQ voltage based on the first pull-down code.

12. The ZQ calibration circuit of claim 11, wherein the second calibration circuit comprises:

a fifth comparator configured to generate a fifth counting signal by comparing the first ZQ voltage with a third reference voltage;

a sixth comparator configured to generate a sixth counting signal by comparing the first ZQ voltage with a fourth reference voltage;

a second pull-up counter configured to count a second pull-up code based on the fifth counting signal, the sixth counting signal, and a second counting enable signal;

a second pull-up driver configured to pull-up drive the first ZQ voltage based on the second pull-up code;

a second switch connected to the second pull-up counter and turned on based on a second logic level of the clock signal to electrically interconnect the second pull-up counter and the second pull-up driver;

a seventh comparator configured to generate a seventh counting signal by comparing the second ZQ voltage with the first reference voltage;

an eighth comparator configured to generate an eighth counting signal by comparing the second ZQ voltage with the second reference voltage;

a second pull-down counter configured to count a second pull-down code based on the seventh counting signal, the eighth counting signal, and the second counting enable signal; and a second pull-down driver configured to pull-down drive the second ZQ voltage based on the second pull-down code.

13. The ZQ calibration circuit of claim 12, wherein the first pull-up driver is configured to output a first signal, and the first pull-down driver is configured to output a second signal.

14. The ZQ calibration circuit of claim 12, wherein the second pull-up driver is configured to output a third signal, and wherein the second pull-down driver is configured to output a fourth signal.

15. The ZQ calibration circuit of claim 13, wherein a level of the first reference voltage is higher than a level of the second reference voltage, wherein, based on a level of the first ZQ voltage that is lower than or equal to the level of the first reference voltage and that is equal to or higher than the level of the second reference voltage, the first signal is at a logic high level, wherein a level of the third reference voltage is higher than a level of the fourth reference voltage, and, wherein, based on a level of the second ZQ voltage that is lower than or equal to the level of the third reference voltage and that is equal to or higher than the level of the fourth reference voltage, the second signal is at a logic high level.

16. The ZQ calibration circuit of claim 14, wherein a level of the first reference voltage is higher than a level of the second reference voltage, wherein, based on a level of the first ZQ voltage that is lower than or equal to the level of the first reference voltage and that is equal to or higher than the level of the second reference voltage, the third signal is at a logic high level, wherein a level of the third reference voltage is higher than a level of the fourth reference voltage, and, wherein, based on a level of the second ZQ voltage that is lower than or equal to the level of the third reference voltage and that is equal to or higher than the level of the fourth reference voltage, the fourth signal is at a logic high level.

17. A ZQ calibration method comprising:

generating a first counting signal by comparing a first ZQ voltage with a first reference voltage, wherein the first ZQ voltage is generated from a ZQ pad connected to an external resistor;

generating a second counting signal by comparing the first ZQ voltage with a second reference voltage;

counting a first pull-up code based on the first counting signal, the second counting signal, and a first counting enable signal;

turning on a first switch and turning off a second switch based on a first logic level of a clock signal; and pull-up driving the first ZQ voltage based on the first pull-up code.

18. The ZQ calibration method of claim 17, further comprising:

generating a third counting signal by comparing a second ZQ voltage, which is different from the first ZQ voltage, with the first reference voltage;

generating a fourth counting signal by comparing the second ZQ voltage with the second reference voltage;

counting a first pull-down code based on the third counting signal, the fourth counting signal, and the first counting enable signal; and pull-down driving the second ZQ voltage based on the first pull-down code.

19. The ZQ calibration method of claim 18, further comprising:

generating a fifth counting signal by comparing the first ZQ voltage with a third reference voltage;

generating a sixth counting signal by comparing the first ZQ voltage with a fourth reference voltage;

counting a second pull-up code based on the first-fifth counting signal, the sixth counting signal, and a second counting enable signal;

turning off the first switch and turning on the second switch based on a second logic level of the clock signal; and pull-up driving the first ZQ voltage based on the second pull-up code.

20. The ZQ calibration method of claim 19, further comprising:

generating a seventh counting signal by comparing the second ZQ voltage with the third reference voltage;

generating an eighth counting signal by comparing the second ZQ voltage with the fourth reference voltage;

counting a second pull-down code based on the seventh counting signal, the eighth counting signal, and the second counting enable signal; and pull-down driving the second ZQ voltage based on the second pull-down code.

* * * * *